(12) United States Patent
Park

(10) Patent No.: US 8,730,735 B2
(45) Date of Patent: May 20, 2014

(54) METHOD OF PROGRAMMING A SEMICONDUCTOR MEMORY DEVICE

(75) Inventor: Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 178 days.

(21) Appl. No.: 12/960,996

(22) Filed: Dec. 6, 2010

(65) Prior Publication Data

US 2011/0249505 A1 Oct. 13, 2011

(30) Foreign Application Priority Data

Apr. 13, 2010 (KR) .......................... 10-2010-0033719

(51) Int. Cl.
*G11C 11/34* (2006.01)
(52) U.S. Cl.
USPC .................................................... 365/185.19
(58) Field of Classification Search
USPC .................................................... 365/185.19
See application file for complete search history.

(56) References Cited

U.S. PATENT DOCUMENTS

| 7,936,624 | B2* | 5/2011 | Clinton | 365/203 |
| 8,498,160 | B2* | 7/2013 | Kim et al. | 365/185.22 |
| 2008/0056035 | A1* | 3/2008 | Nazarian | 365/201 |
| 2008/0144370 | A1* | 6/2008 | Park et al. | 365/185.03 |
| 2008/0151633 | A1* | 6/2008 | Park et al. | 365/185.19 |
| 2010/0091576 | A1* | 4/2010 | Kwon et al. | 365/185.25 |
| 2011/0051514 | A1* | 3/2011 | Han et al. | 365/185.09 |

FOREIGN PATENT DOCUMENTS

KR 1020090048763 5/2009

OTHER PUBLICATIONS

Notice of Preliminary Rejection issued from Korean Intellectual Property Office on Aug. 17, 2011.

* cited by examiner

*Primary Examiner* — Huan Hoang
*Assistant Examiner* — Pablo Huerta
(74) *Attorney, Agent, or Firm* — IP & T Group LLP

(57) ABSTRACT

A method of programming a semiconductor memory device by applying a program voltage to a selected word line in an incremental step pulse program mode includes raising a voltage of precharging a bit line for program inhibition according to an increase in the program voltage applied to the selected word line.

10 Claims, 6 Drawing Sheets

_US 8,730,735 B2_

METHOD OF PROGRAMMING A SEMICONDUCTOR MEMORY DEVICE

CROSS-REFERENCE TO RELATED APPLICATIONS

The present application claims priority under 35 U.S.C 119(a) to Korean Application No. 10-2010-0033719, filed on Apr. 13, 2010 in the Korean Intellectual Property Office, which is incorporated herein by reference in its entirety.

BACKGROUND

1. Technical Field

Exemplary embodiments of the present invention relate to a method of programming a semiconductor memory device.

2. Related Art

Industrial and commercial demands for semiconductor memories capable of electrically programming and erasing, and reserving data without power supply are increasing. Also, higher integration density of memory cells has been dramatically advanced for the purpose of larger data capacity. One of these semiconductor memories is called a nonvolatile memory device. A nonvolatile memory device is generally equipped with a plurality of cell strings, each of which is formed of a plurality of memory cells coupled in series.

FIG. 1 depicts a section of a cell string 100 in a semiconductor memory device.

As depicted in FIG. 1, in the cell string 100 of the semiconductor memory device, 32 memory cells C0 to C31 are serially connected between a drain selection transistor DST and a source selection transistor SST.

The semiconductor memory device may include a plurality of the cell strings 100. The drain selection transistors DST of the cell strings 100 are coupled respectively to bit lines BL. The source selection transistors SST of the cell strings 100 are commonly coupled to a common source line SSL.

The memory cells C0 to C31 are coupled respectively to word lines WL0~WL31.

A plurality of the cell strings 100 constitute a memory cell array (not shown) that is included in the semiconductor memory device.

Each memory cell is selected by the word and bit lines corresponding thereto.

Each memory cell is constructed by including a floating gate FG and a control gate CG.

In each memory cell, a threshold voltage is elevated when electrons are charged at the floating gate FG. Performing an operation to elevate the threshold voltage of the memory cell is referred to as programming.

The semiconductor memory device is programmed on a page-by-page basis. A voltage for programming, i.e., a program voltage Vpgm, is applied to the memory cells that are coupled to the word lines in a page.

When programming the memory cell C0 coupled to the word line WL0, the program voltage Vpgm of a high level is applied to the word line WL0, while a pass voltage Vpass is applied to the other word lines WL1 to WL31.

While programming in this manner may be performed to any of the memory cells, several memory cells should be maintained in erased states, so that not all of the memory cells belonging to a single page are programmed.

However, since gates of the memory cells are commonly coupled to one word line, the program voltage Vpgm is also applied to the memory cells that should be held in erased states. For that reason, program inhibition is needed to prevent the memory cells, which are to be kept in erased states, from being programmed even when the program voltage Vpgm is applied to their gates through the word line.

For program inhibition, a technique called self-boosting has been conventionally used in the semiconductor memory device.

FIG. 2 is a timing diagram showing a self-boosting scheme of a semiconductor memory device.

Below, FIG. 2 is described with reference to FIG. 1, and it is assumed that the cell string is to be program-inhibited.

If the memory cell C0 of the cell string 100 is selected to be program-inhibited, the bit line BL is precharged to a level of a power voltage VCC before applying a program voltage or pass voltage to the word lines. At this time, the power voltage VCC is also applied to a drain selection line DSL and 0V is applied to a source selection line SSL.

If the pass voltage Vpass is applied to all of the word lines, a voltage across the memory cells, i.e., a channel voltage of the cell string, slowly increases as the pass voltage Vpass increases. And, responding to an increase of the voltage applied to the word line WL0, the channel voltage of the cell string is proportionally elevated together. For example, with the pass voltage Vpass at about 10V and the program voltage Vpgm at about 18V, the channel voltage of the cell string rises to about 8V.

Where 18V is applied to the control gate CG of the memory cell C0 and the channel voltage is 8V, a voltage gap of about 10V between the control gate CG and the channel is generated. This voltage gap of about 10V is not enough to charge the floating gate FG, and thus, the memory cell C0 is prevented from being programmed. Such a manner of program-inhibiting by increasing the channel voltage is known as a self-boosting scheme.

SUMMARY

Exemplary embodiments of the present invention are directed to a method of programming a semiconductor memory device, so that a memory cell of the semiconductor memory device is prevented from becoming programmed (i.e., it is program-inhibited).

In an exemplary embodiment, a method of programming a semiconductor memory device includes precharging all bit lines to a first voltage, discharging a voltage of a selected bit line in accordance with data to be programmed, programming and program-verifying memory cells coupled to the selected bit line using a first program voltage applied to a selected word line associated with the selected bit line, precharging all bit lines to a second voltage, which is higher than the first voltage, if the program-verifying determines a program failure, discharging a voltage of the selected bit line, having the second voltage, in accordance with data to be programmed, and programming and program-verifying the memory cells coupled to the selected bit line using a second program voltage, which is higher than the first program voltage, applied to the selected word line.

If the program-verifying determines a program failure after programming with the second program voltage, the method may be further include precharging all bit lines to a third voltage, which is higher than the second voltage, discharging a voltage of the selected bit line, having the third voltage, in accordance with the data to be programmed, and programming and program-verifying the memory cells coupled to the selected bit line using a third program voltage, which is higher than the second program voltage, applied to the selected word line.

In another exemplary embodiment, a method of programming a semiconductor memory device by applying a program voltage to a selected word line in an ISPP mode includes raising a voltage of precharging a bit line for program inhibition according to an increase in the program voltage applied to the selected word line.

In yet another exemplary embodiment, a method of programming a semiconductor memory device includes precharging all bit lines to a first voltage, discharging a selected bit line, programming memory cells coupled to the selected bit line by applying a first program voltage to a selected word line, precharging all bit lines to a second voltage, which is higher than the first voltage, discharging the selected bit line, after precharging all bit lines to a second voltage, and programming the memory cells coupled to the selected bit line by applying a second program voltage, which is higher than the first program voltage, to the selected word line.

These programming methods, in accordance with exemplary embodiments of the present invention, reduce a rate of peak current by varying a precharging voltage, which is applied to the bit lines for program inhibition, according to a level of the program voltage, which increases in the ISPP mode. Moreover, these exemplary embodiments make it possible to lower a level of the pass voltage, which is applied to unselected word lines, by varying the precharging voltage that is applied to the bit lines for program inhibition.

A further understanding of the nature and advantages of the present invention herein may be realized by reference to the remaining portions of the specification and the attached drawings.

BRIEF DESCRIPTION OF THE DRAWINGS

The present invention is illustrated by way of example, and not by way of limitation, in the figures of the accompanying drawings, in which like reference characters refer to similar elements; the drawings briefly described as follows.

DESCRIPTION OF EMBODIMENTS

Hereinafter, various exemplary embodiments will now be described more fully with reference to the accompanying drawings in which some exemplary embodiments are shown. The specific structural and functional details disclosed herein are merely representative for purposes of describing exemplary embodiments of the present invention.

The terminology used herein is for the purpose of describing particular embodiments only and is not intended to limit the number of exemplary embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also it should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects are hereinafter described with reference to the attached drawings.

Figure 1:
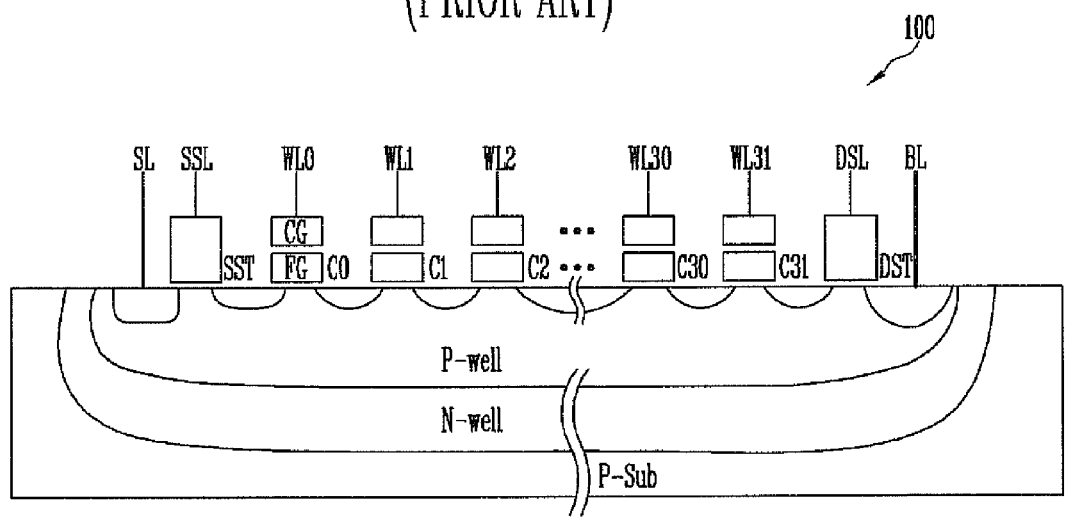
FIG. 1 illustrates a section of a cell string in a semiconductor memory device.
Figure 2:
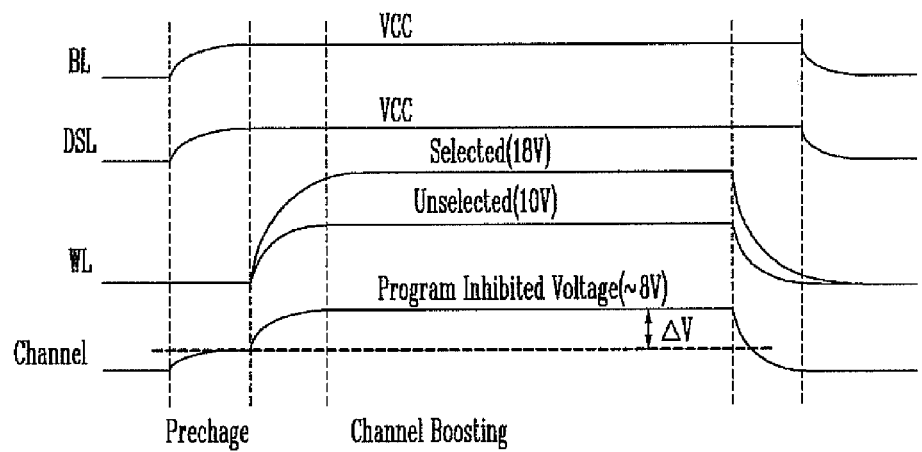
FIG. 2 is a timing diagram showing a self-boosting scheme of a semiconductor memory device.
Figure 3:
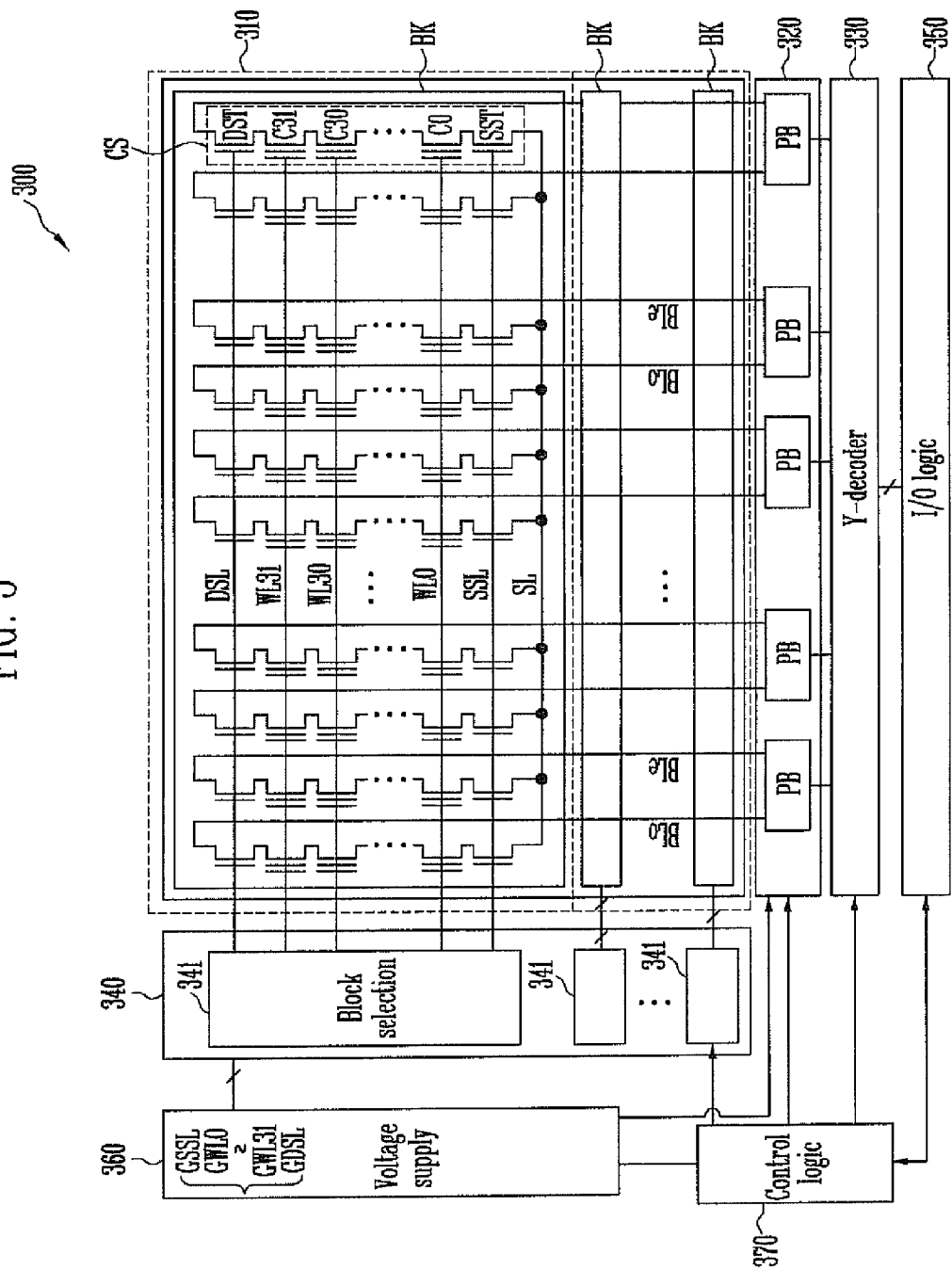
FIG. 3 is a block diagram of a semiconductor memory device according to an exemplary embodiment of the present invention.

FIG. 3 is a block diagram of a semiconductor memory device according to an exemplary embodiment of the present invention.

Referring to FIG. 3, the semiconductor memory device 300 is organized by including a memory cell array 310, a page buffer group 320 including page buffers PB, a Y-decoder 330, an X-decoder 340, an input/output logic circuit 350, a voltage supply circuit 360, and a control logic circuit 370.

The memory cell array 310 may include a plurality of memory blocks BK.

Each memory block BK may include a plurality of cell strings CS.

Each cell string CS includes a drain selection transistor DST, a source selection transistor SST, and memory cells C0 to C31.

The memory cells C0 to C31 are serially coupled between the drain selection transistor DST and the source selection transistor SST of a corresponding cell string CS.

Each cell string CS is coupled to either an odd bit line BLo or an even bit line BLe. More specifically, the drains of the drain selection transistors DST are coupled to an odd bit line BLo or an even bit line BLe. The odd bit lines BLo and the even bit lines BLo may be arranged in an alternating pattern.

The sources of the source selection transistors SST are commonly coupled to a common source line SL.

The gates of the drain selection transistors DST are commonly coupled to a drain selection line DSL. The gates of the source selection transistors SST are commonly coupled to a source selection line SSL.

The control gates of the memory cells C0 to C31 are coupled to word lines WL0 to WL31, respectively. Further, memory cells of a corresponding row are commonly coupled to the same word line.

The page buffer group 320 includes one or more page buffers PB, which are coupled to a pair of bit lines. Each pair of bit lines includes one odd bit line BLo and one even bit line BLe.

The Y-decoder 330 functions to provide data input/output paths for the page buffers PB of the page buffer group 320 in response to control signals.

The X-decoder 340 includes block selection circuits 341 that are correspondingly coupled to the memory blocks BK.

The block selection circuit 341 enables its corresponding memory block BK in response to an address signal supplied from the control logic circuit 370. If a memory block BK is enabled by the block selection circuit 341, the lines of the memory block BK, i.e., SSL, WL0 to WL31, and DSL, are electrically connected to global lines GSSL, GWL0 to GWL31, and GDSL, which are supplied with operation voltages.

The operation voltages supplied to the global lines GSSL, GWL0 to GWL31, and GDSL are generated from the voltage supply circuit 360.

The voltage supply circuit 360 generates the operation voltages in response to control signals of the control logic circuit 370 and provides them to the global lines GSSL, GWL0 to GWL31, and GDSL.

The input/output logic circuit 350 controls data input/output operations between the semiconductor memory device 300 and an external system in response to one or more input/output control signals.

The control logic circuit 370 includes circuitry for performing logical operations in order to create control signals to operate the page buffer group 320, the Y-decoder 330, the X-decoder 340, the input/output logic circuit 350, and the voltage supply circuit 360.

Figure 4:
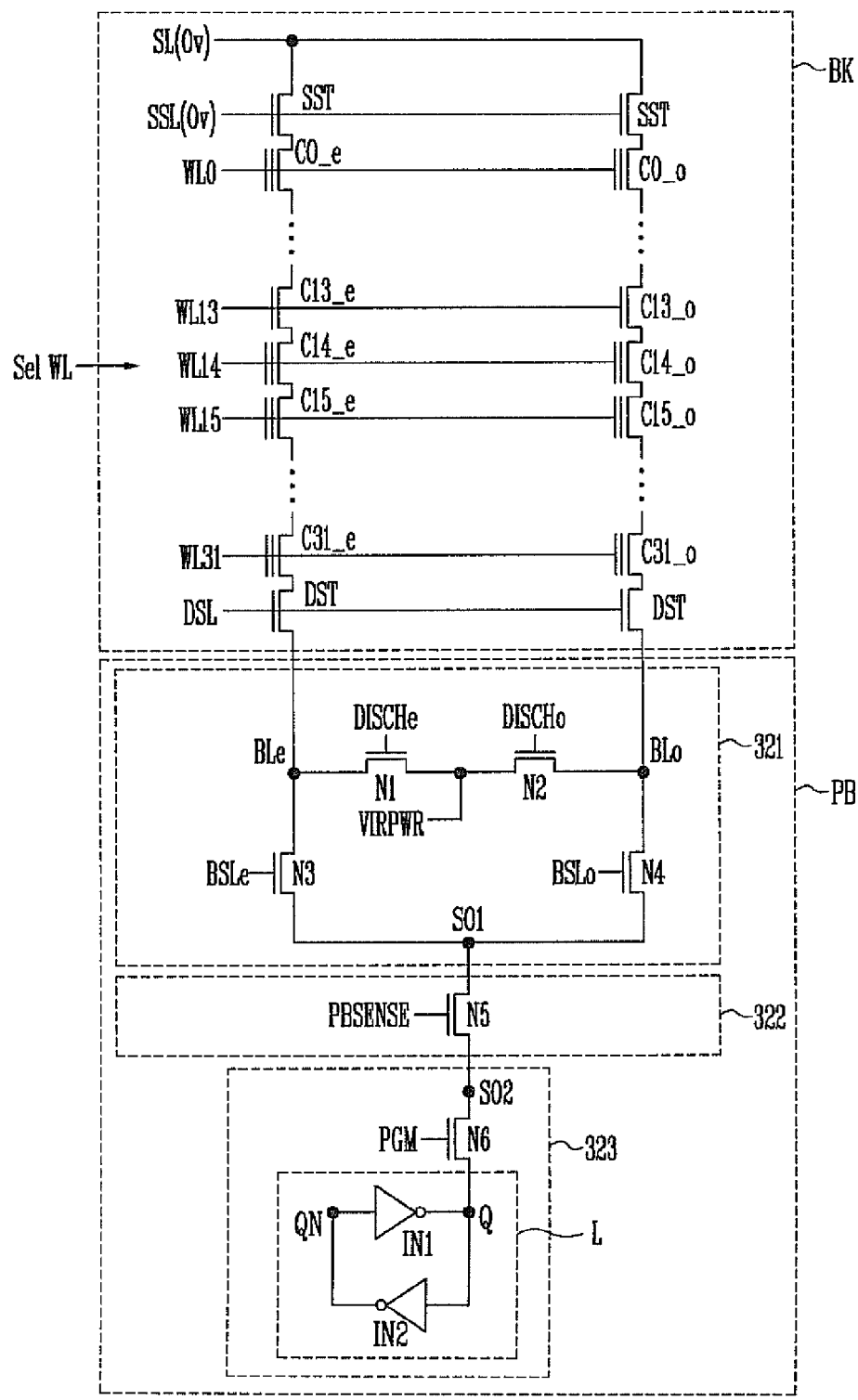
FIG. 4 is a circuit diagram partly illustrating cell strings and a page buffer group of FIG. 3.

FIG. 4 partly illustrates the cell strings CS and the page buffer group 320 of FIG. 3.

More specifically, FIG. 4 shows two cell strings CS, coupled with even and odd bit lines, BLe and BLo, of the memory block BK, and a page buffer PB shared by the even and odd bit lines BLe and BLo.

For convenience of description, reference characters of the memory cells are modified to reflect their correspondence with the even and odd bit lines BLe and BLo.

In more detail, the memory cells coupled to the even bit line BLe are denoted by reference characters C0_e through C31_e, while the memory cells coupled to the odd bit line BLo are denoted by reference characters C0_o through C31_o.

Further, in order to describe a practical programming process, it is assumed that the word line WL14 is selected (i.e., for the following example the selected word line SelWL is the fourteenth word line WL14).

The page buffer PB includes a bit line selector 321, a sensor 322, and a latch circuit 323.

The bit line selector 321 connects the even or odd bit line, BLe or BLo, to a first sensing node 501 in response to control signals of the control logic circuit 370.

The bit line selector 321 precharges or discharges the even or odd bit line, BLe or BLo, to a level of a power voltage VCC or to 0V in response to the control signals of the control logic circuit 370.

For this function, the bit line selector 321 may be composed of first through fourth NMOS transistors N1 to N4.

The first and second NMOS transistors, N1 and N2, are serially connected between the even and odd bit lines BLe and BLo. A variable voltage VIRPWR is applied to a conjunction node between the first and second NMOS transistors N1 and N2. The voltage level of the variable voltage VIRPWR is dependent upon the control logic circuit 370.

An even discharge signal DISCHe is applied to the gate of the first NMOS transistor N1. An odd discharge signal DISCHo is applied to the gate of the second NMOS transistor N2.

The even and odd discharge signals, DISHe and DISHo, are supplied from the control logic circuit 370.

The third NMOS transistor N3 is electrically connected between the even bit line BLe and the first sensing node S01. The fourth NMOS transistor N4 is electrically connected between the odd bit line BLo and the first sensing node S01.

An even bit-line selection signal BSLe is applied to the gate of the third NMOS transistor N3. An odd bit-line selection signal BSLo is applied to the gate of the fourth NMOS transistor N4. The even and odd bit-line selection signals, BSLe and BSLo, are supplied from the control logic circuit 370.

The first and second NMOS transistors, N1 and N2, operate to precharge or discharge the even and odd bit lines BLe and BLo.

The third and fourth NMOS transistors, N3 and N4, operate to conductively connect the even or odd bit line BLe or BLo with the first sensing node 501.

The sensor 322 operates to conductively connect the first sensing node 501 with a second sensing node 502 in response to a sensing signal PBSENSE.

For this function, the sensor 322 includes a fifth NMOS transistor N5. The fifth NMOS transistor N5 is electrically connected between the first and second sensing nodes 501 and 502.

Further, the sensing signal PBSENSE is applied to the gate of the fifth NMOS transistor N5.

The fifth NMOS transistor N5 is turned on or off in response to a voltage level of the first sensing node S01 and a voltage level of the sensing signal PBSENSE that is applied to its gate.

The latch circuit 323 temporarily stores data, which is to be written in a programming operation, in a latch L and transfers the data to the second sensing node 502 from the latch L.

The latch L included in the latch circuit 323 functions to hold data corresponding to a voltage level of the second sensing node 502. Although not shown, it should be understood that the circuit of FIG. 4 also includes a circuit for inputting program data into the latch L, and a circuit for changing data of the latch L in response to a voltage level of the second sensing node 502.

The latch circuit 323 is exemplarily composed of a sixth NMOS transistor N6, a first inverter IN1, and a second inverter IN2.

The sixth NMOS transistor N6 is electrically connected between the second sensing node S02 and a node Q. A program signal PGM is applied to the gate of the sixth NMOS transistor N6.

The first and second inverters, IN1 and IN2, form the latch L between the node Q and the counter node QN. More specifically, the output of the first inverter IN1 is coupled to the input of the second inverter IN2, while the output of the second inverter IN2 is coupled to the input of the first inverter IN1.

In order to successfully program data in a memory cell array, where the even and odd bit lines BLe and BLo are commonly coupled to a single page buffer PB, as shown in FIG. 4, all of the unselected bit lines should be forced into the state of program inhibition.

For program inhibition, the semiconductor memory device uses the self-boosting scheme.

Figure 5:
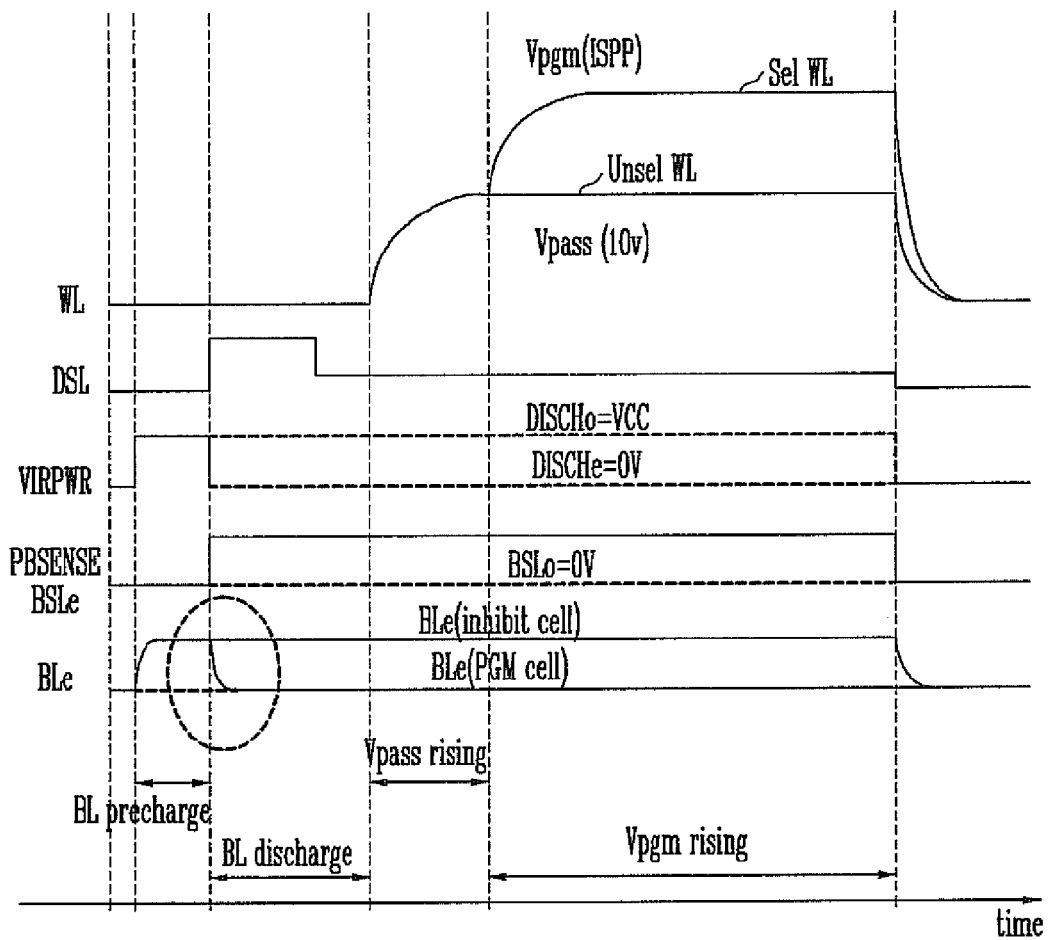
FIG. 5 is a timing diagram illustrating voltages of various elements within a semiconductor memory device during a general programming operation.

FIG. 5 is a timing diagram illustrating a general programming operation.

FIG. 5 is described with reference to FIGS. 3 and 4.

The timing diagram of FIG. 5 shows an exemplary case in which data is programmed to an even bit line BLe.

In order to perform a programming operation to store data into the semiconductor memory device 300, the semiconductor memory device 300 receives a program command, address information indicating an address to be programmed, and data to be programmed from an external system (not shown).

The program command and the address information and data to be programmed (hereinafter, referred to as "program address information" and "program data") are applied to the input/output logic circuit 350.

Then, the input/output logic circuit 350 transfers the program command, the program address information, and the program data to the control logic circuit 370.

If the program command is input into the semiconductor memory device 300 from an external system (not shown), the control logic circuit 370 controls the voltage supply circuit 360 to generate the program voltage Vpgm and pass voltage Vpass in response to the program command.

The control logic circuit 370 provides the control signals for controlling operations of programming according to the program command and the program address information.

Responding to a control signal from the control logic circuit 370, the voltage supply circuit 360 generates the operation voltages, such as the program voltage Vpgm and the pass voltage Vpass.

The block selection circuits 341 of the X-decoder 340 enable or disable corresponding memory blocks in response to address signals, which are provided from the control logic circuit 370.

In the meantime, the control logic circuit 370 enables the input/output logic circuit 350 to store the program data in the latches L of the page buffer group 320.

Programming begins by precharging the bit lines (BL precharge).

To precharge the bit lines, the control logic circuit 370 drives the variable voltage VIRPWR to a level of the power voltage VCC, and outputs the even and odd discharge signals DISCHe and DISCHo, having logical high levels.

Accordingly, the first and second NMOS transistors, N1 and N2, are turned on to precharge the even and odd bit lines BLe and BLo to the level of the power voltage VCC.

During the BL precharge period, as shown in FIG. 5, the cell string CS is disconnected from the bit lines BLe and BLo because the drain selection line DSL is maintained at 0V.

After precharging all of the even and odd bit lines BLe and BLo, the programming operation proceeds to discharge unselected bit lines (BL discharge). That is, discharging is not performed on all of the bit lines, but rather is selectively performed. For example, as shown in FIG. 5, the even bit line BLe may be maintained in the former precharged state or discharged in accordance with data that is stored in the latch L of the page buffer PB.

In the BL discharge period of this programming operation, the control logic circuit 370 changes the even and odd discharge signals, DISCHe and DISCHo, to logical low levels. Furthermore, during the BL discharge period, the control logic circuit 370 applies the even bit-line selection signal BSLe of a logical high level, the sensing signal PBSENSE of a logical high level, and the program signal PGM of a logical high level to the page buffer PB.

Accordingly, the third, fifth, and sixth NMOS transistors N3, N5 and N6 are turned on to electrically connect the even bit line BLe with the node Q of the latch L.

If data stored at the node Q of the latch L is '0', the even bit line BLe is discharged. Otherwise, if data stored at the node Q of the latch L is '1', the even bit line BLe is kept in the precharged state.

If the node Q stores a '0', a shift in a threshold voltage of the selected memory cell is required to program data. If the node Q stores a '1', a threshold voltage of the selected memory cell must be prevented from changing (i.e., the selected memory cell must be program-inhibited).

In other words, a selected bit line (e.g., BLe) is discharged to 0V when a selected memory cell (e.g., C14_e) is to be programmed, or maintained in the precharged state with the level of the power voltage VCC when the selected memory cell is to be program-inhibited. Referring to FIG. 5, the resulting voltage levels of the selected even bit line under both circumstances are shown in the dashed oval.

While discharging or keeping the bit line in the precharged state, the drain selection line DSL is set to the level of the power voltage VCC for a time period, and thereafter drops to a lower voltage. The lower voltage may be, for example, approximately 2V. When the drain selection line DSL reaches the lower voltage, the drain selection transistor DST is turned on.

Precharging and discharging the bit lines may be collectively referred to as a bit-line voltage setting process.

After the bit-line voltage setting process, all of the word lines, i.e., WL0 to WL31, are supplied with the pass voltage Vpass (Vpass rising). During the Vpass rising period, the voltage levels of the word lines WL0 to WL31 rise until they reach the pass voltage Vpass (e.g., 10V).

Then, after the Vpass rising period, an increased voltage is applied to a selected word line, e.g., WL14, (Vpgm rising). In the Vpgm rising period, the voltage level of the selected word line (e.g., WL14) rises to the level of the program voltage Vpgm, while the voltage levels of the unselected word lines (e.g., WL0 to WL13 and WL15 to WL31) remain at the voltage level of the pass voltage Vpass.

When the pass voltage Vpass is applied to the word lines WL0 to WL31, there is a relatively slow increase in a channel voltage of the cell string CS, which is coupled to the odd bit line BLo that has been precharged to the voltage level of the power voltage VCC, and in a channel voltage of the cell string CS, which is coupled to the even bit line BLe that has been kept in the precharged state (i.e., where the even bit line BLe is associated with data '1' which is stored in the latch L). Then, when the program voltage Vpgm is applied to the selected word line (e.g., WL14), the channel voltage of the cell strings CS, which are coupled to the even and odd bit lines BLe and BLo, is further raised. In particular, the channel voltage of the cell string CS, which is coupled to the unselected odd bit line BLo, may be further raised, for example, to a voltage level of about 10V.

Accordingly, a sufficiently high voltage, for example, a voltage of 18V, is applied to the gate of the memory cell C14_o, which is coupled to the odd bit line BLo that is to be program-inhibited. Because the channel voltage of the cell string CS, which is coupled to the unselected odd bit line, is sufficiently high, for example, at a voltage level of about 10V, the memory cell C14_o cannot be programmed.

The aforementioned process is referred to as the self-boosting scheme.

During the process of self-boosting, the bit lines, coupled to cell strings to be program-inhibited, are all precharged to the level of the power voltage VCC. The power voltage VCC supplied to the bit lines is determined according to the program voltage Vpgm. For example, the power voltage VCC may be determined given that the program voltage Vpgm is the highest level of the operation voltages used in the semiconductor memory device.

When programming, all of the bit lines belonging to the memory block BK should first be precharged. However, as a result of precharging, peak currents of a relatively large amount may be induced. A rate of the peak current becomes higher as the semiconductor memory device 300 decreases in size. An increase of the peak current means that more current is dissipated in the semiconductor memory device 300.

Meanwhile, as the bit lines are supplied with the power voltage VCC, the pass voltage Vpass is adjusted to be adequately higher than the power voltage level. If the pass voltage Vpass is too high or low, disturbance may cause threshold voltages of the memory cells to be inadvertently varied.

Figure 6:
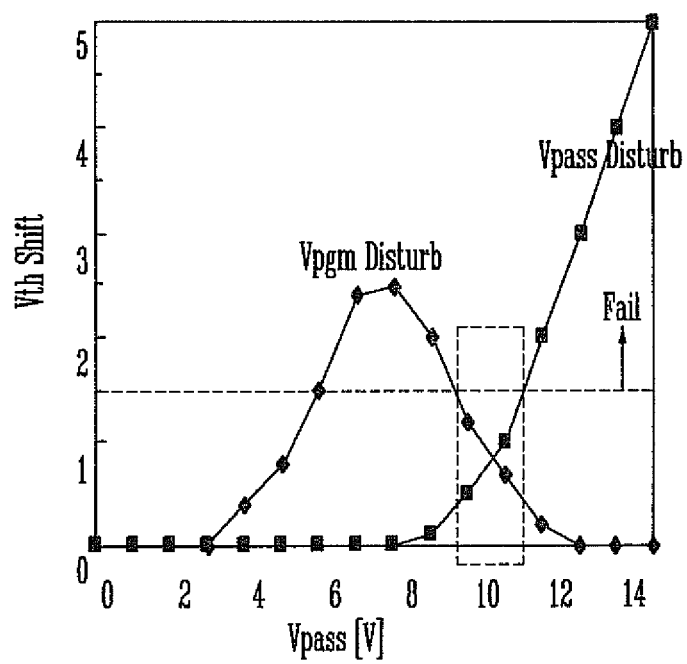
FIG. 6 is a graph plotting variations of threshold voltages of memory cells due to disturbance induced while programming data.

FIG. 6 is a graph plotting variations of threshold voltages of memory cells due to disturbance induced while programming data.

From FIG. 6, a pattern, in which disturbance is dependent on a level of the pass voltage Vpass, can be seen.

In consideration of disturbance arising from a correlative interaction between the program voltage Vpgm and the pass voltage Vpass, a voltage level of the pass voltage Vpass may be adjusted. However, when precharging the bit lines, which are coupled to cell strings to be program-inhibited, to the level of the power voltage VCC, a margin for adjusting the pass voltage Vpass becomes narrow because the pass voltage Vpass must be over a certain voltage level.

As stated above, a voltage of precharged bit lines may be controlled for the purpose of program-inhibiting memory cells.

Figure 7:
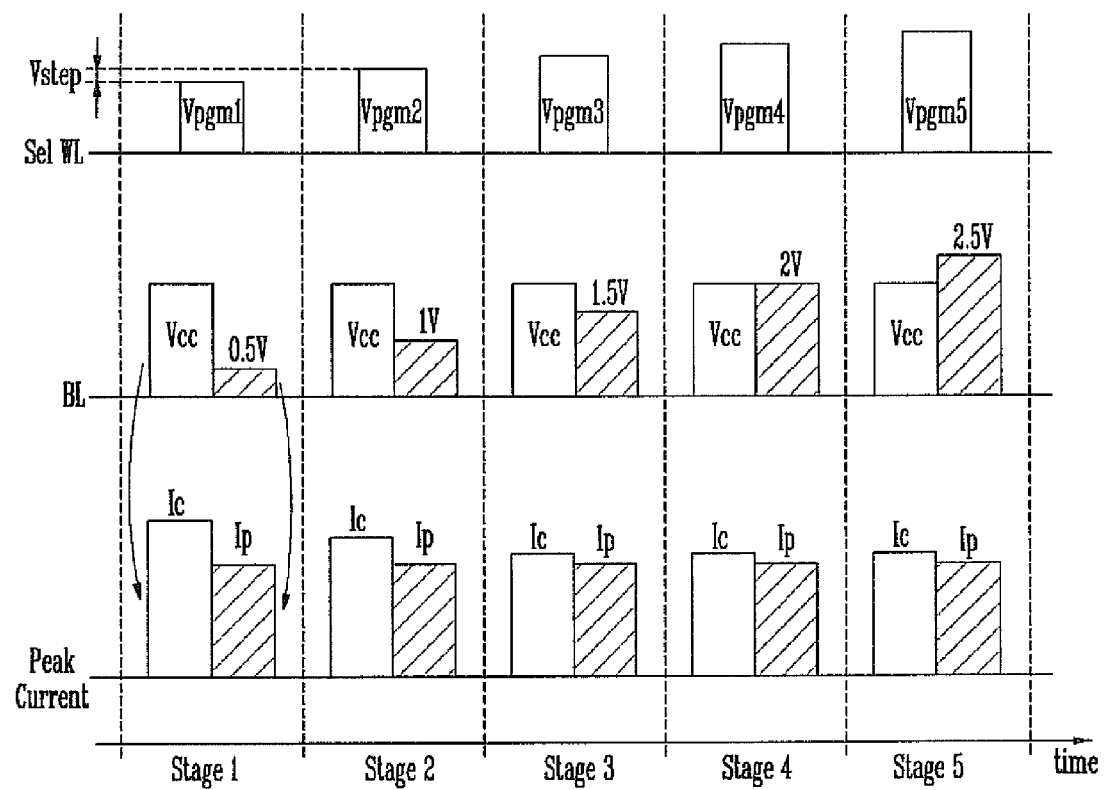
FIG. 7 is a graph illustrating voltages to be applied in a programming operation according to an exemplary embodiment of the present invention.

FIG. 7 is a graph illustrating voltages to be applied in a programming operation according to an exemplary embodiment of the present invention.

In FIG. 7, voltages at different stages throughout a programming operation are shown. First, FIG. 7 shows program voltages Vpgm applied to the selected word line (Sel WL). Second, FIG. 7 shows voltage levels of precharged bit lines for program inhibition in a case where the power voltage VCC is constantly applied and in a case, according to an exemplary embodiment of the present invention, where the precharged voltage levels are varied (see the shaded regions). Finally, FIG. 7 also shows peak currents in a case of uniformly precharging the bit lines to the level of the power voltage VCC and in a case according to an exemplary embodiment of the present invention (see the shaded regions).

The voltage patterns depicted in FIG. 7 are described with reference to FIGS. 3 and 4.

In a programming method according to exemplary embodiments of the present invention, bit lines are first precharged to a voltage level according to a voltage level of the program voltage Vpgm applied to the selected word line (Sel WL).

In an exemplary programming method, the bit lines BL, which are coupled to cell strings CS having memory cells that are to be program inhibited, are precharged to 0.5V. Thus, program inhibition may be achieved when a first step pulse of the program voltage, Vpgm1, is applied to the selected word line (e.g., WL14).

Then, the bit lines are further precharged to 1V. Thus, program inhibition may be achieved when a second step pulse of the program voltage, Vpgm2, is applied to the selected word line. Here, the second step pulse Vpgm2 is higher than the first step pulse Vpgm1 by a step voltage Vstep.

Subsequently, for the purpose of maintaining the state of program inhibition, the voltage level of precharged bit lines is increased in proportion to the increase of the program voltage Vpgm by the step voltage Vstep.

Referring to FIG. 7, when consistently precharging the bit lines to the voltage level of the power voltage VCC, a peak current Ic (corresponding to a peak current in the conventional method of programming) is considerably high at the first stage of programming and lowered as the program voltage Vpgm increases.

In comparison, a peak current Ip, according to an exemplary embodiment of the present invention, is almost constant even while the program voltage Vpgm increases by the step voltage Vstep. That is, an average rate of current dissipation in an exemplary embodiment of the present invention may be reduced in comparison to that of the conventional case.

A programming method, according to the exemplary embodiments of the present invention, is carried out by increasing a voltage level, which precharges the bit lines, by a certain increment up to the program voltage Vpgm.

There may be various manners in varying a voltage of the precharged bit lines. One way is to control the variable voltage VIRPWR to increase whenever the step pulses of the program voltage are applied to the selected word line.

Also, the precharged voltage may be increased by a certain step level or varied in proportion to the increment of the program voltage Vpgm.

As described above with reference to FIG. 6, by varying the bit-line precharging voltage in proportion to an increment of the program voltage, program disturbance due to the pass voltage may be reduced. This is because such an adequate modification of the precharging voltage of the bit lines can make the self-boosting effective even though the pass voltage Vpass is set at a lower voltage level, e.g., about 9V, within the dotted rectangle of FIG. 6. As the pass voltage Vpass is reduced, the disturbance can be reduced.

The foregoing describes exemplary embodiments of the invention, and is not to be construed as limiting the invention. Although a few exemplary embodiments have been described, those skilled in the art will readily appreciate that many modifications are possible in view of the described exemplary embodiments without materially departing from the novel teachings. Accordingly, all such modifications are intended to be included within the scope of this invention as defined in the claims.

What is claimed is:

1. A method of programming a semiconductor memory device, the method comprising:
   precharging all bit lines, including selected and unselected bit lines, to a first voltage;
   discharging a voltage of the selected bit line in accordance with data to be programmed;
   programming and program-verifying memory cells coupled to the selected bit line using a first program voltage applied to a selected word line associated with the selected bit line;
   precharging all bit lines, including selected and unselected bit lines, to a second voltage, which is higher than the first voltage, if the program-verifying determines a program failure;
   discharging a voltage of the selected bit line, having the second voltage, in accordance with data to be programmed; and
   programming and program-verifying the memory cells coupled to the selected bit line using a second program voltage, which is higher than the first program voltage, applied to the selected word line.

2. The method of claim 1, which, if the program-verifying determines a program failure after programming with the second program voltage, further comprises:
   precharging all bit lines to a third voltage, which is higher than the second voltage;
   discharging a voltage of the selected bit line, having the third voltage, in accordance with the data to be programmed; and
   programming and program-verifying the memory cells coupled to the selected bit line using a third program voltage, which is higher than the second program voltage, applied to the selected word line.

3. The method of claim 1, wherein the difference between the first voltage and the second voltage depends upon the difference between the first program voltage and the second program voltage.

4. The method of claim 2, wherein a difference between the first and second voltages is the same as a difference between the second and third voltages.

5. A method of programming a semiconductor memory device by applying a program voltage to a selected word line in an incremental step pulse program mode, the method comprising:
- precharging all bit lines, including selected and unselected bit lines, to a first voltage;
- discharging a voltage of the selected bit line in accordance with data to be programmed;
- programming and program-verifying memory cells coupled to the selected bit line using a first program voltage applied to the selected word line;
- precharging all bit lines, including selected and unselected bit lines, to a second voltage, which is higher than the first voltage, if the program-verifying determines a program failure;
- discharging a voltage of the selected bit line, having the second voltage, in accordance with data to be programmed; and
- programming and program-verifying the memory cells coupled to the selected bit line using a second program voltage, which is higher than the first program voltage, applied to the selected word line.

6. The method of claim 5, which, if the program-verifying determines a program failure after programming with the second program voltage, further comprises:
- precharging all bit lines, including selected and unselected bit lines, to a third voltage, which is higher than the second voltage;
- discharging a voltage of the selected bit line, having the third voltage, in accordance with the data to be programmed; and
- programming and program-verifying the memory cells coupled to the selected bit line using a third program voltage, which is higher than the second program voltage, applied to the selected word line.

7. The method of claim 5, wherein the bit line precharge voltage is raised by a first step.

8. The method of claim 7, wherein the program voltage is raised by a second step.

9. A method of programming a semiconductor memory device, the method comprising:
- precharging all bit lines, including selected and unselected bit lines, to a first voltage;
- discharging the selected bit line;
- programming memory cells coupled to the selected bit line by applying a first program voltage to a selected word line;
- precharging all bit lines, including selected and unselected bit lines, to a second voltage, which is higher than the first voltage;
- discharging the selected bit line, after precharging all bit lines to a second voltage; and
- programming the memory cells coupled to the selected bit line by applying a second program voltage, which is higher than the first program voltage, to the selected word line.

10. The method of claim 9, further comprising verifying whether programming is a pass or fail, after programming with the first program voltage.

* * * * *